(12) United States Patent
Komatsu

(10) Patent No.: US 7,135,883 B2
(45) Date of Patent: Nov. 14, 2006

(54) INSPECTION METHOD AND INSPECTION APPARATUS FOR INSPECTING ELECTRICAL CHARACTERISTICS OF INSPECTION OBJECT

(75) Inventor: Shigekazu Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/311,269

(22) Filed: Dec. 20, 2005

(65) Prior Publication Data

US 2006/0097743 A1    May 11, 2006

Related U.S. Application Data

(63) Continuation of application No. PCT/JP04/08292, filed on Jun. 8, 2004.

(30) Foreign Application Priority Data

Jun. 20, 2003   (JP) ............................ 2003-177024

(51) Int. Cl.
   *G01R 31/26*   (2006.01)
(52) U.S. Cl. ................................... 324/765
(58) Field of Classification Search ............... 324/754, 324/756, 757, 758, 765, 158.1, 73.1, 72.5
   See application file for complete search history.

(56) References Cited

U.S. PATENT DOCUMENTS 4,929,893 A * 5/1990 Sato et al. .................. 324/758
5,321,352 A   6/1994 Takebuchi .............. 324/158 F
5,436,571 A * 7/1995 Karasawa .................. 324/765
5,742,173 A * 4/1998 Nakagomi et al. .......... 324/758
6,501,289 B1 * 12/2002 Takekoshi .................. 324/758

FOREIGN PATENT DOCUMENTS

| JP | 63-086445 | 4/1988 |
| JP | 4-361543 | 12/1992 |
| JP | 5-198662 | 8/1993 |
| JP | 6-163651 | 6/1994 |
| JP | 8-335613 | 12/1996 |
| JP | 9-33236 | 2/1997 |
| JP | 9-51023 | 2/1997 |

* cited by examiner

*Primary Examiner*—Jermele Hollington
*Assistant Examiner*—Tung X. Nguyen
(74) *Attorney, Agent, or Firm*—Oblon, Spivak, McClelland, Maier & Neustadt, P.C.

(57) ABSTRACT

An inspection method including measuring a height of a load cell of a load detecting mechanism using a laser length measuring mechanism, obtaining a first rise amount of the load detecting mechanism from a measuring position of the load detecting mechanism up to a contact starting position, measuring a height of an electrode of a wafer using the laser length measuring mechanism, and obtaining a second rise amount of a main chuck up to the contact starting point of the electrode with the probe based on a difference between a measuring height of the electrode of the wafer and the measuring height of the load detecting mechanism.

10 Claims, 5 Drawing Sheets

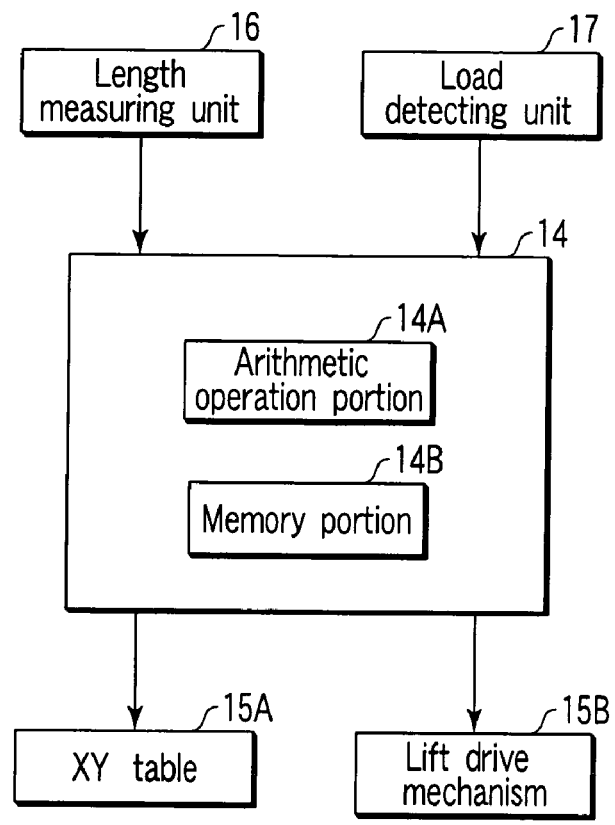
F I G. 2
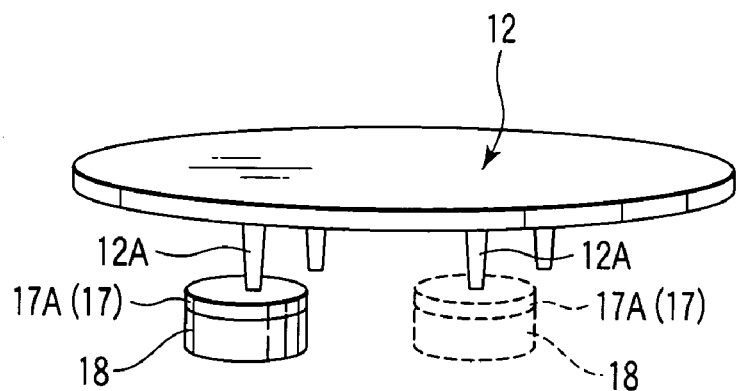
F I G. 3

INSPECTION METHOD AND INSPECTION APPARATUS FOR INSPECTING ELECTRICAL CHARACTERISTICS OF INSPECTION OBJECT

CROSS-REFERENCE TO RELATED APPLICATIONS

This is a Continuation Application of PCT Application No. PCT/JP2004/008292, filed Jun. 8, 2004, which was published under PCT Article 21(2) in Japanese.

This application is based upon and claims the benefit of priority from prior Japanese Patent Application No. 2003-177024, filed Jun. 20, 2003, the entire contents of which are incorporated herein by reference.

BACKGROUND OF THE INVENTION

1. Field of the Invention

The present invention relates to an inspection method and an inspection apparatus for inspecting the electrical characteristics of an inspection object. More specifically, the present invention relates to an inspection method and inspection apparatus in which contact (for example, probe) is brought into contact with the inspection object when the electrical characteristics of the inspection object are inspected.

2. Description of the Related Art

This kind of the inspection apparatus includes a loader chamber 1 for carrying an inspection object (for example, wafer) W and a prober chamber 2 for inspecting the electrical characteristics of the wafer W sent from the loader chamber 1 as shown in FIGS. 6A and 6B. The loader chamber 1 includes a cassette storage portion 3, a wafer carrying mechanism 4 for carrying the wafer W to the loader chamber 1 and a sub-chuck 5 for aligning the wafer W preliminarily. These components are controlled by a control unit (not shown).

The prober chamber 2, as shown in FIGS. 6A and 6B, includes a table (hereinafter referred to as "main chuck") 11 on which the wafer W received from the wafer carrying mechanism 4 is mounted, an XY table 7 for moving the main chuck 11 in the horizontal direction (X and Y directions), a contact holding mechanism (hereinafter referred to as "probe card") 12 disposed above the main chuck 11, a plurality of contacts (hereinafter referred to as "probe") 12A of the probe card 12 and an alignment mechanism 13 for aligning a plurality of electrodes of the wafer W on the main chuck 11 with the probe.

The alignment mechanism 13 includes an upper camera 13B attached to an alignment bridge 13A and a lower camera 9C attached to the main chuck 11. As the alignment bridge 13A advances to a probe center in the center from the deep side of the front side of the prober chamber 2 along a pair of guide rails 13D, alignment of the electrodes of the wafer W with the probe 12A is carried out.

Upon alignment, the XY table 7 moves the main chuck 11 so as to lead the lower camera 9C attached to the main chuck 11 to just below the probe card 12. At this position, a lift mechanism 15B lifts the main chuck 11 and the lower camera 9C photographs a tip of a predetermined probe 12A. The control unit calculates the positional coordinates of X, Y and Z of the tip of the probe 12A from a position of the main chuck 11 at this time. Next, the alignment bridge 13A advances to the probe center and the upper camera 13B and the lower camera 9C are focused on a target 9E, so that the optical axes of both the cameras 13B, 9C are aligned. A reference position of the main chuck 11 can be obtained from the positional coordinate at this time. After that, the upper camera 13B photographs a predetermined electrode of the wafer W. The control unit calculates the positional coordinates of X, Y and Z of the electrode from the position of the main chuck 11 at this time. The electrode of the wafer W and the probe 12A are aligned based on these positional coordinates.

As shown in FIG. 6A, a test head T is disposed on the head plate 2A of the prober chamber 2 such that it may be opened and closed. The test head T and the probe card 12 are connected electrically with each other through a performance board (not shown). An inspection signal sent by a tester (not shown) to the probes 12A through the test head T and the performance board is applied to electrodes of the wafer W from the probes 12A. The electrical characteristics of a plurality of devices on the wafer W are inspected using this inspection signal.

Upon inspection, the electrodes of the wafer W is overdriven further after it comes into contact with the probe 12A and then comes into electrical contact with the probe 12A with a predetermined pressure.

At this time, a distance between the tip of the probe 12A and the electrode of the wafer W is detected at a high accuracy. By lifting the main chuck 11 just by a detected distance, the probe 12A and the electrode are brought into contact with each other securely. By overdriving the main chuck 11 from this contact position, the electrode comes into contact with the probe 12A electrically. A height of the main chuck 11 in which the probe 12A and the electrode come into contact with each other just before the overdrive is applied is called contact starting point.

According to the above-described inspection methods, the lower camera 9C of the alignment mechanism 13 photographs the tip of the probe 12A in order to obtain the contact starting point. As other inspection method, there are a method of securing electrical contact by obtaining a point in which electric conduction between the probe 12A and the electrode is started, a method of securing electrical contact after a needle trace formed by contact of the probe 12A and the electrode is inspected and the like.

As an inspection apparatus which brings an electrode into contact with the probe with electrical stability, there are an inspection apparatus described in the scope of claim for patent, paragraphs [0013], [0014] and abstract of disclosure of patent document 1 (Jpn. Pat. Appln. KOKAI Publication No. 9-51023) and an inspection apparatus described in the scope of claim for a patent, paragraph [0018] and abstract of disclosure of patent document 2 (Jpn. Pat. Appln. KOKAI Publication No. 6-163651). The semiconductor test apparatus described in the patent document 1 includes a needle drive mechanism, a pressure detection mechanism, a comparison operation control portion and a ring operation mechanism. The comparison operation control portion compares a pressure signal of the probe from the pressure detection mechanism with a reference value and the ring operation mechanism is driven based on a signal from the comparison operation control portion so as to correct an inclination of the probe ring.

The semiconductor wafer inspection apparatus described in the patent document 2 includes a pressure sensor for detecting a contact pressure between the probe and electrode and an appropriate contact pressure is secured based on a contact pressure detected by the pressure sensor.

However, according to a conventional inspection method, the lower camera 9C of the alignment mechanism 13 photographs the tip of the probe 12A from just below to detect the tip of the probe 12A as shown schematically in FIG. 7. Because the quantity of light at the tip is insufficient, a position slightly above the tip (for example, position at a needle diameter d of 5–8 μm) needs to be photographed. Thus, the position detected as the tip of the probe 12A accompanies an error of about 10 μm. The contact starting point with the electrode is difficult to detect accurately because of this error.

To search for a contact starting point in which conduction between the probe 12A and the electrode is started, the contact starting point needs to be found out accurately before the overdrive is applied to the main chuck 11. The amount of necessary overdrive fluctuates due to the condition of oxide film on the electrode surface and consequently it is difficult to obtain a stable pressure by the overdrive.

To visually inspect a probe trace on an electrode surface, the electrode needs to be overdriven in order to mark the probe trace. The height suitable for formation of the probe trace is affected by the pressure and the surface configuration of the electrode. Further, visual inspection of the probe trace varies depending on individual difference because the probe trace is very fine.

In the semiconductor test apparatus of the patent document 1, the inclination of the probe ring supporting the probe card needs to be corrected each time the electrode is brought into contact with the probe electrically.

The semiconductor wafer inspection apparatus of the patent document 2 controls a contact pressure by a pressure sensor provided on the wafer chuck. Thus, the contact pressure needs to be controlled each time the electrode is brought into contact with the probe electrically.

BRIEF SUMMARY OF THE INVENTION

According to a first aspect of the present invention, there is provided an inspection method for inspecting electrical characteristics of an inspection object by bringing each contact into contact with each of a plurality of electrodes of the inspection object placed on a table. The inspection method comprises the following: (a) measuring a height of a reference point provided on the table by a length measuring mechanism; (b) measuring a first rise amount taken for raising the reference point from a position of the table when the height of the reference point is measured up to a contact starting point in which the reference point comes into contact with a tip of the contact; (c) measuring a height of the electrode of the inspection object by the length measuring mechanism; (d) obtaining a second rise amount necessary for raising the electrode of the inspection object up to the contact starting point based on the height of the reference point obtained in (a), the first rise amount up to the contact starting point obtained in (b) and the height of the electrode obtained in (c); (e) bringing the electrode of the inspection object placed on the table into contact with the tip of the contact by raising the table only by the second rise amount obtained in (d); and (f) inspecting the electrical characteristics of the inspection object with the electrode and the tip of the contact in contact with each other electrically.

According to a second aspect of the present invention, there is provided an inspection method for inspecting electrical characteristics of an inspection object by bringing each contact into contact with a plurality of electrodes of the inspection object placed on a table. The inspection method comprises the following: (a) measuring a height of a load detecting mechanism provided on the table by a length measuring mechanism; (b) measuring a first rise amount taken for raising the load detecting mechanism from a position of the load detecting mechanism when the height of the load detecting mechanism is measured up to a contact starting point in which the load detecting mechanism comes into contact with a tip of the contact; (c) measuring a height of the electrode by means of the length measuring mechanism; and (d) obtaining a second rise amount necessary for raising the electrode up to the contact starting point based on the height of the load detecting mechanism measured in (a), the first rise a mount measured in (b) and the height of the electrode measured in (c).

The inspection method according to the first aspect and the inspection method according to the second aspect preferably further comprise one or a combination of a plurality of the following A) to H):

A) (e) bringing the electrode of the inspection object placed on the table into contact with the tip of the contact by raising the table only by the second rise amount obtained in (d); and (f) inspecting the electrical characteristics of the inspection object with the electrode and the tip of the contact kept in electric contact with each other;

B) (b1) measuring the height of the contact starting point corresponding to a plurality of electrodes of the inspection object by repeating the (b2) and measuring the degree of parallelization between the table and the inspection object based on each height;

C) (c1) measuring the height of a plurality of electrode surfaces of the inspection object by repeating the (c); and (c2) obtaining an inclination of a plane formed by the plurality of the electrodes based on the measured heights of the plurality of the electrodes;

D) (d1) obtaining the second rise amount of each of the plurality of the electrodes of the inspection object by repeating the (d); and (d2) obtaining the degree of parallelization between the table and a plane formed by the tip of the contacts based on the second rise amount of each of the plurality of the electrodes;

E) the length measuring mechanism is an optical system length measuring mechanism;

F) the length measuring mechanism is an alignment mechanism to align the electrode of the inspection object with the contact of the contact holding mechanism;

G) the length measuring mechanism has a capacity sensor; and

H) the load detecting mechanism has a load cell.

According to a third aspect of the present invention, there is provided an inspection apparatus for inspecting electrical characteristics of an inspection object. The inspection apparatus comprises the following: a table on which an inspection object is to be mounted (the table comprises a moving mechanism to raise/lower the table); a contact holding mechanism disposed at a position opposing the table and having a plurality of contacts; a load detecting mechanism provided on the table (the load detecting mechanism detects a contact load when the contact makes contact with the load detecting mechanism); a length measuring mechanism (the length measuring mechanism measures a height of the load detecting mechanism and a height of an electrode of the inspection object); and a control unit (the control unit detects a first moving amount necessary for the table to move up to a contact starting point between the load detecting mechanism and the contact based on a load measuring signal output from the load detecting mechanism when the load detecting mechanism comes into contact with the contact by the movement of the table, and the control unit further obtains a second moving amount necessary for bringing the electrode of the inspection object into contact with the tip of the contact based on the height of the load detecting mechanism, the height of the electrode of the inspection object and the first moving amount).

The inspection apparatus according to the third aspect preferably further comprises one or a combination of a plurality of the following I) to M):

I) the length measuring mechanism comprises an optical system length measuring mechanism;
J) the length measuring mechanism is provided on an alignment mechanism to align the inspection object with the contact holding mechanism;
K) the length measuring mechanism is an alignment mechanism to align the electrode of the inspection object with the contact of the contact holding mechanism;
L) the load detecting mechanism has a load cell; and
M) the load detecting mechanism has a lifting/lowering mechanism.

BRIEF DESCRIPTION OF THE SEVERAL VIEWS OF THE DRAWING

FIG. 2 is a block diagram showing major portions of a control unit of the inspection apparatus shown in FIG. 1;

FIG. 3 is an explanatory diagram showing a condition for obtaining a contact starting point using the inspection apparatus shown in FIG. 1;

FIG. 6A is a partially broken front view and FIG. 6B is a plan view showing the inside thereof.

DETAILED DESCRIPTION OF THE INVENTION

An object of the present invention is to solve at least one of the above described problems.

Hereinafter, the present invention will be described about the embodiments shown in FIGS. 1 to 5.

Figure 1:
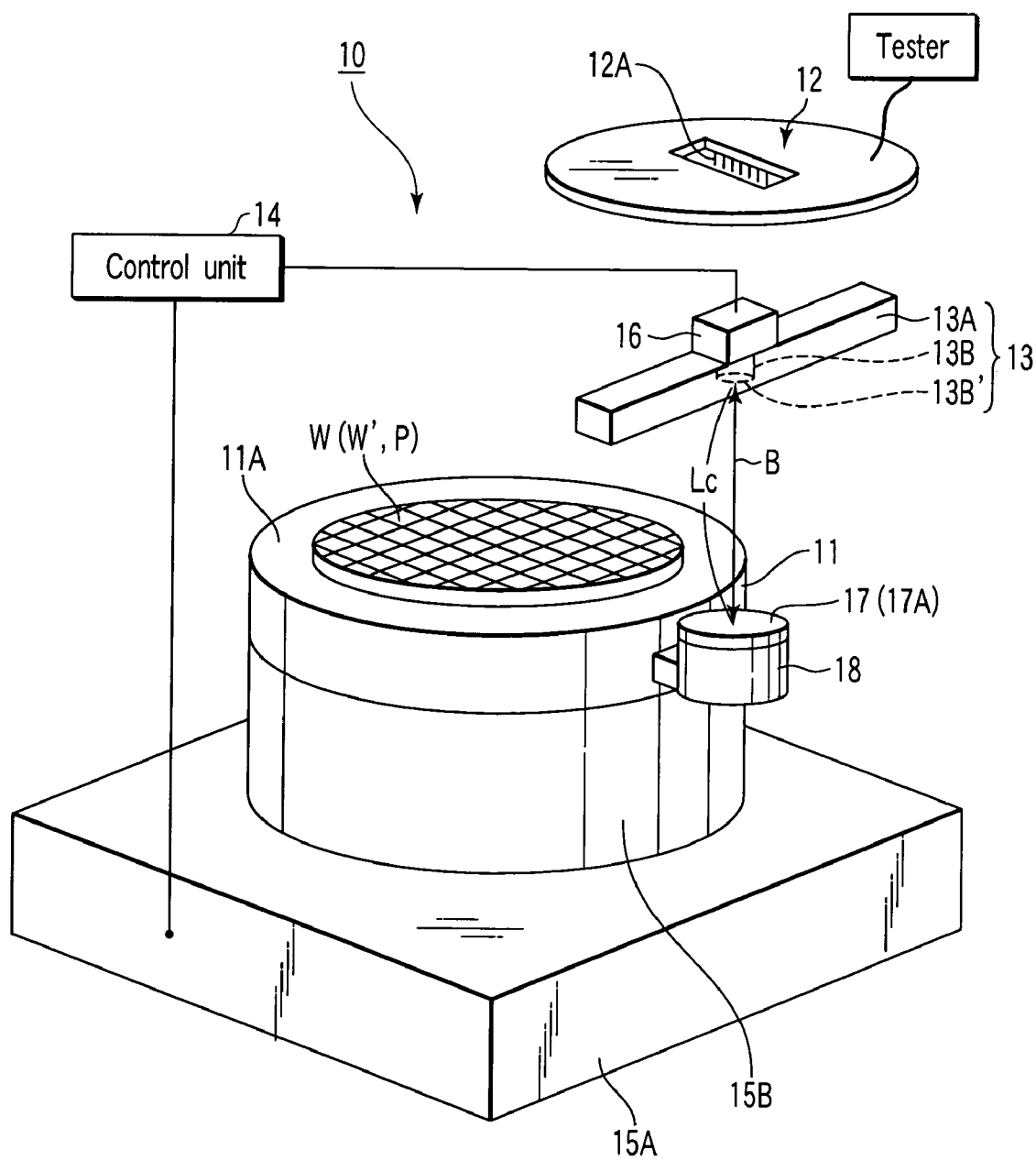
FIG. 1 is a diagram showing major portions of an embodiment of the inspection apparatus of the present invention and an explanatory diagram showing a condition for measuring a distance up to a load cell using a laser length measuring mechanism.

As shown in FIG. 1, an inspection apparatus 10 of this embodiment includes a table (hereinafter referred to as "main chuck") 11 on which an inspection object (for example, device W' formed on a wafer W) is mounted and moves horizontally and vertically, a contact holding mechanism (hereinafter referred to as "probe card") 12 disposed above this main chuck 11, contacts (hereinafter referred to as "probes") 12A of the probe card 12, and an alignment mechanism 13 for aligning electrodes P of an inspection object W' corresponding to the contacts. The inspection apparatus 10 inspects the electrical characteristics of the inspection object W' under the control of a control unit 14.

As shown in FIG. 2, the main chuck 11 is moved horizontally by an XY table 15A under the control of the control unit 14. The main chuck 11 is lifted and lowered by a lift drive mechanism 15B (see FIG. 2). The alignment mechanism 13 includes an alignment bridge 13A, an upper camera 13B, a guide rail 13D (FIG. 6B) and the like as in the conventional technique. The alignment bridge 13A reciprocates between the deepest portion of a prober chamber and a probe center.

Although as shown in FIG. 1, a length measuring mechanism (for example, optical system length measuring mechanism (for example, laser length measuring mechanism)) 16 may be provided independently within the inspection apparatus, it may be attached to the alignment bridge 13A. A load detecting mechanism 17 having a weight sensor (for example, load cell) 17A may be provided on the main chuck 11. As shown in FIG. 2, the control unit 14 may include an arithmetic operation portion 14A and a memory portion 14B. The control unit 14 controls the main chuck 11 based on a measuring signal of the laser length measuring mechanism 16 and a pressure signal of the load detecting mechanism 17 and may detect a contact starting point between the electrode P of the inspection object W' and the probe 12A as described later.

Figure 4:
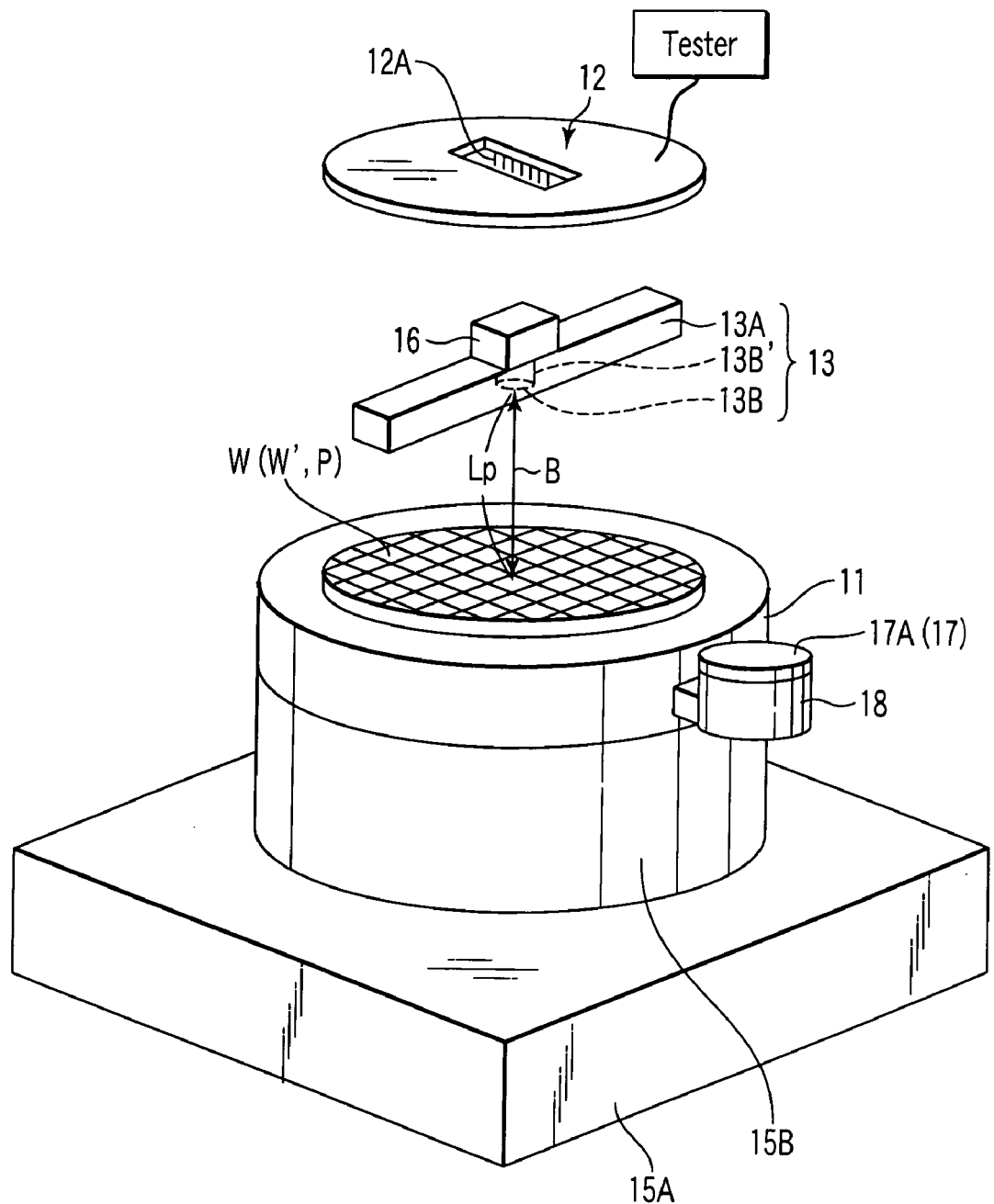
FIG. 4 is an explanatory diagram showing a condition for measuring a distance up to an electrode of a wafer using the laser length measuring mechanism shown in FIG. 1.

As shown in FIGS. 1 and 4, the laser length measuring mechanism 16 measures a distance $L_C$ between a lens 13B' and the load cell 17A or a distance $L_P$ between the lens 13B' and the electrode P (FIG. 4) at a high accuracy by irradiating laser beam B to the load cell 17A or the electrode P of the inspection object W' on the main chuck 11 from the lens 13B' of the upper camera 13B. According to this embodiment, the distances $L_P$, $L_C$ can be measured easily and securely after the position of the load cell 17A and the position of the electrode P of the inspection object W are detected by the alignment mechanism 13 because the laser beam B is irradiated from the upper camera 13B.

The load detecting mechanism 17 may be disposed on any of the top face or the side face of the main chuck 11. If the load detecting mechanism 17 is disposed on the side face of the main chuck 11, a supporting base 18 is provided horizontally on the side face of the main chuck 11 and the load detecting mechanism 17 is disposed on this supporting base 18. The load detecting mechanism 17 may be disposed at any position as long as it can be moved horizontally and vertically together with the main chuck 11.

Figure 5:
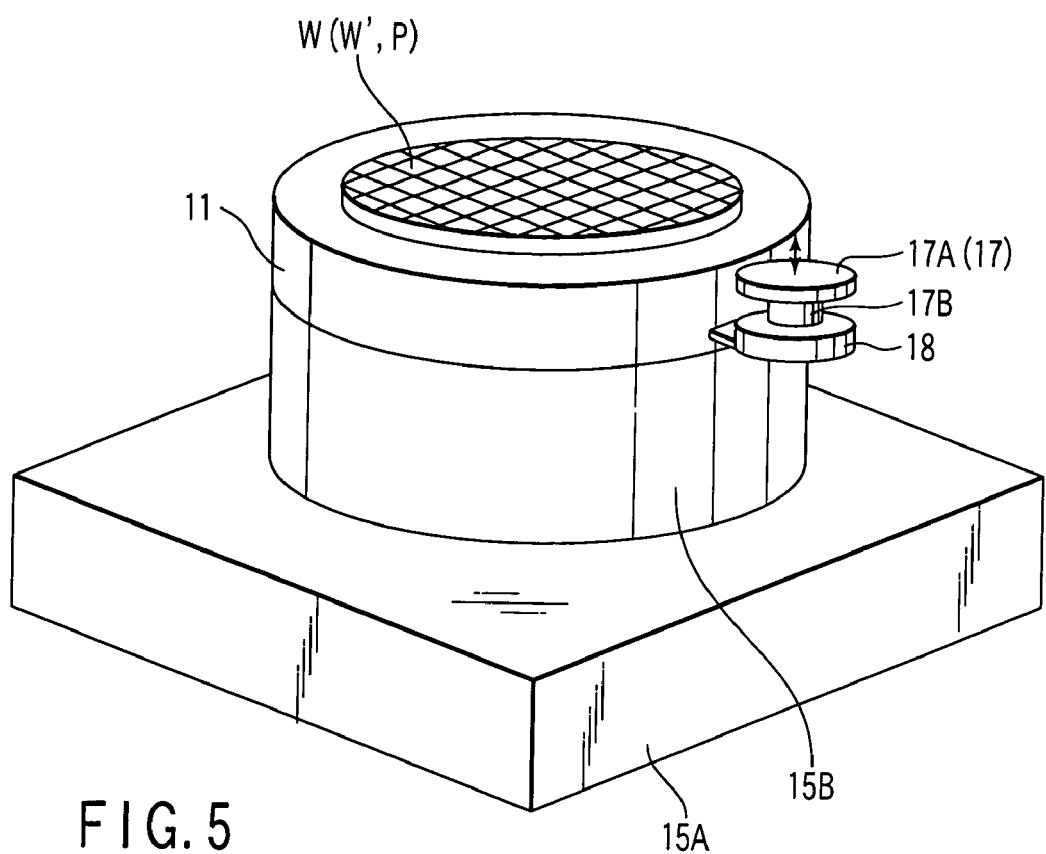
FIG. 5 is a perspective view showing a load detecting mechanism used in another embodiment of the inspection apparatus of the present invention.
Figure 7:
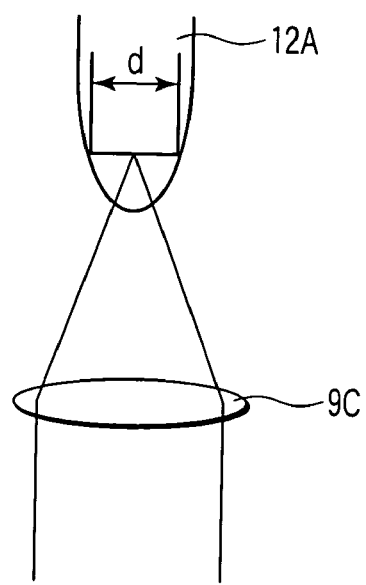
FIG. 7 is an explanatory diagram of a condition in which the tip of a probe is photographed with a lower camera of an alignment mechanism.

Although this load detecting mechanism 17 may be of any mechanism capable of detecting the pressure of the probe 12A, it is preferable to employ the load cell 17A. The load cell 17A is preferred to have a sensitivity capable of detecting a pressure of, for example, 0.05 g or less. Although the height of the surface of the load cell 17A is arbitrary, it is preferred to be set to substantially the same height as that of a mounting face 11A of the main chuck 11. It is permissible to dispose the load cell 17A slightly above the wafer mounting face 11A upon detection of load and retreat it downward when it is not used. In this case, as shown in FIG. 5, a lifting/lowering mechanism 17B provided on the supporting base 18 is capable of lifting and lowering the load cell 17A. The lift mechanism 17B can be controlled by the control unit 14. The lift mechanism 17B may use a well known motor drive system or air cylinder drive system.

A position in which a predetermined pressure is detected by the load cell 17A of the load detecting mechanism 17 may be a contact starting point of the electrode P of the inspection object W' and the probe 12A. According to this embodiment, the predetermined pressure is set to 0.05 g. Therefore, after the electrode P of the inspection object W' reaches the contact starting point, the electrode P may be always brought into contact with the probe 12A with a constant pressure without being affected by the kind of the probe card 12 and the wafer W by moving the inspection object W' to the side of the probe 12A only by a specified overdrive amount (lifting in this embodiment). As a result, the electrode P may be brought into contact with the probe 12A electrically.

The position of the contact starting point (hereinafter, referred to as "height of the contact starting point") of the main chuck 11 may be obtained as follows. The height of a reference point set at the main chuck 11 is measured.

Although any position of the main chuck 11 may be adopted as a reference point, a measuring surface of the load detecting mechanism 17 (for example, load cell 17A) may be adopted as the reference point. If the reference point is set at a different position from the measuring surface of the load detecting mechanism 17, it is important to measure a distance between the reference point and the measuring surface of the load detecting mechanism 17 preliminarily. Hereinafter, a case where the surface of the load cell 17A is adopted as the reference point will be described.

The main chuck 11 is moved horizontally from a length measuring position of the load cell 17A so that the load cell 17A is located just below the probe card 12.

A height $L_C$ of the surface of the load cell 17A is measured using the laser length measuring mechanism 16.

The load cell 17A is brought into contact with the probe 12A by lifting up the main chuck 11. A pressure detected by the load cell 17A of the load detecting mechanism 17 is sent to the control unit 14.

The arithmetic operation portion 14A of the control unit 14 recognizes a position in which a received pressure reaches a predetermined pressure (for example, 0.05 g) as the contact starting point.

At this time, a lift amount (hereinafter referred to as "first lift amount") of the main chuck 11 is measured. The height of the contact starting point may be obtained based on a first lift amount. The memory portion 14B memorizes this first lift amount.

The height of the electrode P of the inspection object W' on the main chuck 11 is measured using the laser length measuring mechanism 16.

That is, by lowering the main chuck 11 from the contact starting point and moving horizontally, the inspection object W' on the main chuck 11 is brought to just below the probe card 12. Meanwhile, the alignment bridge 13A advances to the probe center so as to position the laser length measuring mechanism 16 above the inspection object W'.

As shown in FIG. 4, the laser length measuring mechanism 16 measures a distance $L_P$ between the lens 13B' and the electrode P. This distance $L_P$ corresponds to the height of the electrode P. A signal $L_P$ is sent to the control unit 14.

The arithmetic operation portion 14A of the control unit 14 obtains a difference $\Delta L$ between the distance $L_P$ and a distance $L_C$.

A second lift amount necessary for lifting up the main chuck 11 from a position in which the height of the load cell is measured up to the contact starting point in which the electrode P of the inspection object W' makes contact with the tip of the probe 12A may be obtained using the difference $\Delta L$.

That is, if the distance $L_C$ of the load cell 17A is longer than the distance $L_P$ of the electrode P, the second lift amount can be obtained by subtracting the difference $\Delta L$ from the first lift amount. Conversely, if the distance $L_C$ is shorter than the distance $L_P$, the second lift amount can be obtained by adding the difference $\Delta L$ to the first lift amount.

To inspect the electrical characteristics of each inspection object W', the wafer W is fed according to index each time each inspection object W' is inspected. After that, the main chuck 11 is lifted up only by a distance corresponding to the second lift amount. As a result of this lift-up, the electrode P arrives at the contact starting point accurately and securely, so that the electrode P makes contact with the probe 12A at a preliminarily set pressure of about 0.05 g.

Upon feeding according to index, the electrode P and the probe 12A may be kept in contact with each other at a stabilized pressure by lifting the main chuck 11 by the same amount after the main chuck 11 is lifted down by a specified amount and then moved horizontally up to a next inspection position. Further, by measuring the distance $L_P$ of the entire surface of the wafer W or some distances $L_P$ of representative points on the wafer W before inspection, they may be kept in contact at a further stable pressure by changing the lift amount after feeding according to index based on a measured $L_P$ value.

As a consequence, the control unit 14 may bring the electrode P into contact with the probe 12A at a predetermined pressure by overdriving the main chuck 11 only by a specified amount regardless of the kind of the probe card 12 and the wafer W.

On the other hand, according to the above-described embodiment, installation condition of the probe card 12 can be checked. First, as indicated exaggeratedly in FIG. 3, the contact starting points of a plurality of the probes 12A located at a plurality of positions of the probe card 12 (for example, four positions of respective corners of the probe card 12) are measured using the load detecting mechanism 17 (load cell 17A). If a difference exists among the measured contact starting points, it may be understood that the probe card 12 is inclined. That is, a degree of parallelization between the main chuck 11 and the face formed by tips of the probes 12A may be obtained based on the height of the contact starting point between the main chuck 11 and each probe 12A. If the main chuck 11 is inclined with respect to the face formed by the tips of the probes 12A, the wafer W on the main chuck 11 may be made parallel to the face formed by the tips of a plurality of the probes 12A by correcting the inclination of the probe card 12 or the main chuck 11.

Next, a first embodiment of the inspection method using the inspection apparatus 10 of this embodiment will be described.

Figure 6:
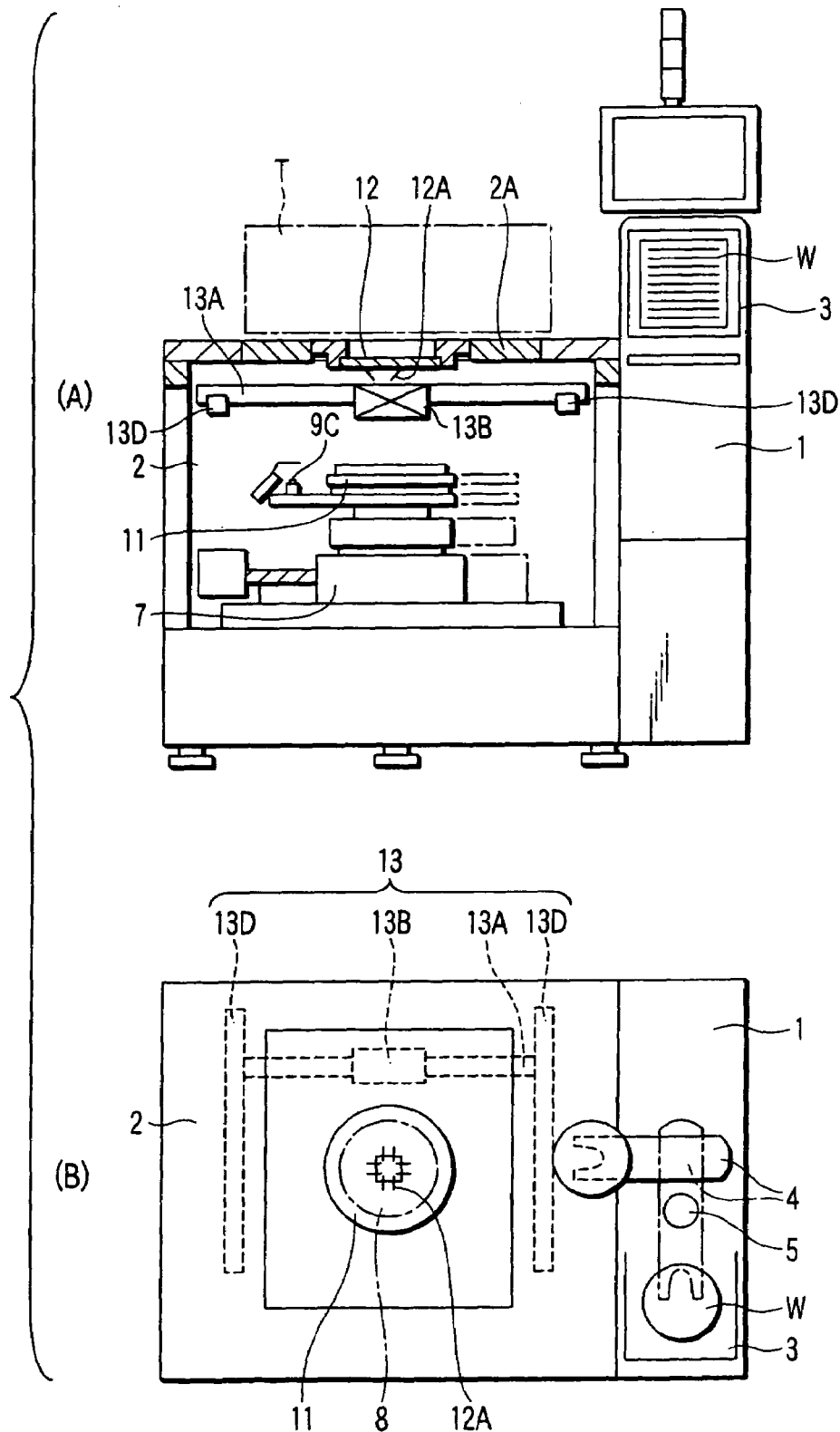
FIG. 6 is a diagram showing an example of a conventional inspection apparatus.

(a) The wafer W is loaded on the main chuck 11 in the prober chamber 2 (FIG. 6A) from the loader chamber 1 (FIG. 6A). The alignment bridge 13A advances up to the probe center (center of the probe card) from the deepest portion of the prober chamber. The wafer W on the main chuck 11 is aligned with the probe card 12 using the alignment mechanism 13 attached to the alignment bridge 13A.

As the main chuck 11 moves horizontally, the upper camera 13B of the alignment bridge 13A finds out the load cell 17A. The load cell 17A is located just below the upper camera 13B, namely, just below the inspection center of the probe card 12. The distance $L_C$ between the lens 13B' of the upper camera 13B and the load cell 17A is measured by irradiating laser beam B to the reference point (here, the weight measuring surface of the load cell 17A is regarded as the reference point) from the laser length measuring mechanism 16. Although the reference point may be a specified position on the measuring surface of the main chuck 11, in this case the distance between the specified position and the weight measuring surface of the load cell 17A is measured. The control unit 14 receives the distance $L_C$ from the laser length measuring mechanism 16 and memorizes it in the memory portion 14B.

(b) The alignment bridge 13A retreats from the probe center and the main chuck 11 rises. The load cell 17A of the load detecting mechanism 17 rises toward the probe 12A. The load cell 17A comes into contact with the probe 12A. The arithmetic operation portion 14A of the control unit 14 judges that the load cell 17A has reached the contact starting point by receiving a pressure signal of a predetermined pressure (for example, 0.05 g) detected by the load cell 17A. A rise amount (first rise amount) of the main chuck 11 in this duration is memorized in the memory portion 14B as a height of the contact starting point.

If the reference point is set up on other than the weight measuring surface of the load cell 17A, the distance between the reference point and the weight measuring surface of the load cell 17A needs to be measured to obtain the height of the contact starting point.

(c) When the main chuck 11 lowers after the height of the contact starting point is obtained, the alignment bridge 13A advances to the probe center. As the main chuck 11 moves horizontally (X direction and Y direction), the upper camera 13B finds out an electrode P at a specified position of the wafer W. As shown in FIG. 4, the distance $L_P$ between the lens of the upper camera 13B and the surface of the electrode P is measured by irradiating laser beam B to the surface of the electrode P of the inspection object W' from the laser length measuring mechanism 16.

(d) The control unit 14 receives a measuring signal $L_P$ from the laser length measuring mechanism 16 and memorizes it in the memory portion 14B of the control unit 14. The arithmetic operation portion 14A of the control unit 14 obtains a difference $\Delta L$ (=$L_C$-$L_P$) between the distance $L_P$ and the distance $L_C$. The second rise amount for raising the electrode P up to the contact starting point can be obtained based on this difference $\Delta L$.

By carrying out (e) and (f) discussed below to the inspection method of the first embodiment, a second embodiment is provided. According to the second embodiment, the probe 12A is brought into contact with the electrode P of the inspection object W' under a predetermined pressure so that they are connected electrically.

(e) As the alignment bridge 13A retreats from the probe center, the main chuck 11 moves horizontally so that the electrode P of a device W' intended to be inspected first is located just below the probe card 12. The main chuck 11 rises only by the second lift amount and the electrode P of the inspection object W' on the main chuck 11 reaches the contact starting point.

Further, the main chuck 11 is overdriven only by an amount set preliminarily, so that the electrode P of the inspection object W' and the probe 12A make electrical contact with each other with a predetermined pressure. With this condition, the electrical characteristics of the inspection object W' are inspected.

(f) Each time the electrical characteristics of each inspection object W' on the wafer W are inspected, the wafer W is fed according to index. After that, by carrying out the above-mentioned (e), the electrical characteristics of a plurality of the inspection objects W' on the wafer W are inspected.

By repeating the (b) in the inspection method of the first embodiment, a third embodiment for measuring the height of the contact starting point corresponding to a plurality of the electrodes P of the inspection object W' and measuring the degree of parallelization between the table 11 and the inspection object W' based on each height is provided.

According to the third embodiment, by adjusting the inclination of the probe card 12 and/or the table 11, the degree of parallelization can be corrected.

By carrying out (c1) and (c2) described below in the inspection method of the first embodiment, a fourth embodiment which obtains the inclination of a plane formed by a plurality of the electrodes P of the inspection object W' is provided.

(c1) By repeating the (c), the heights of a plurality of the electrodes P of the inspection object W' are measured.
(c2) A diffusion of the heights of the electrodes P is obtained based on the measured heights of the plurality of the electrodes P.

By carrying out (d1) and (d2) below in the inspection method of the first embodiment, a fifth embodiment for obtaining the degree of parallelization between the table 11 and a plane formed by the tip of the contact 12A is provided.

According to the fourth embodiment, the inclination of a plane formed by a plurality of the electrodes P can be corrected by adjusting the inclination of the table 11.

(d1) A second rise amount of each of the plurality of the electrodes P of the inspection object W' is obtained by repeating the (d).
(d2) The degree of parallelization between the table 11 and the plane formed by the tip of the contact 12A is obtained based on the second rise amount of each of the plurality of the electrodes P.

According to the fifth embodiment, the degree of parallelization can be corrected by adjusting the inclination of the probe card 12 and/or the table 11.

According to these embodiments, at least one of the features described below can be realized.

The electrode P of the inspection object W' and the probes 12A can be brought into secure and stabilized contact with each other.

The electrode P and the probe 12A can be brought into electrical contact based on an always-constant overdrive amount.

A highly reliable inspection can be carried out.

A constant overdrive amount can be always set up.

The overdrive amount is easy to control.

The contact starting point can be detected without any optical error.

A difference depending on individual operator like when inspecting a needle trace visually can be eliminated.

The degree of parallelization between the probe card 12 and the wafer W on the main chuck 11 can be adjusted based on a plurality of the contact starting points.

The load cell 17 and the electrodes of the wafer W can be found out quickly by irradiating laser beam B of the laser length measuring mechanism 16 from the upper camera 13B.

The present invention is not restricted to the above-described respective embodiments. For example, instead of a structure in which the laser length measuring mechanism 16 is provided on the alignment bridge 13A to irradiate laser beam B from the upper camera 13B, it is permissible to provide the laser length measuring mechanism 16 on a portion other than the alignment bridge 13A.

Any length measuring mechanism (for example, capacitance sensor) capable of measuring a distance up to the load cell 17A and the electrode P of the wafer W can be used.

The load detecting mechanism 17 may adopt other load sensor instead of the load cell 17A.

According to the embodiment, any structure and disposition may be adopted instead of a structure in which the load detecting mechanism 17 is attached to the peripheral face of the main chuck 11, as long as the load detecting mechanism 17 is so constructed to be capable of moving integrally with the main chuck 11.

The contact 12A may adopt any contact 12A (for example, bump) other than the probe 12A as long as the tip thereof is pointed.

Although a case of adjusting the mounting condition of the probe card 12 in order to adjust the degree of parallelization has been described in the above embodiment, it is permissible to adjust the main chuck 11 or both the probe card 12 and the main chuck 11.

According to the first embodiment, the above (e) may be carried out repeatedly in order to inspect the second or subsequent inspection object W' after the electrical characteristics of the first inspection object W' on the wafer W are inspected. The distance for lowering or raising the main chuck 11 for the first inspection object W' may be set to the second rise amount in the above (e) at the time of inspection of the second or subsequent inspection object W'. But, it is permissible to adopt other predetermined amount. That is, by lowering the wafer W by a predetermined amount and feeding the wafer W according to index after the inspection of the first inspection object W' is ended, the second or subsequent inspection object W' is located just below the probe card 12. By raising the wafer W by the predetermined amount, the electrodes P of the second or subsequent inspection object W' on the wafer W can be brought into contact with the probe 12A on the probe card 12 and overdriven.

This predetermined amount may be adopted as an optimal value based on a measuring result of the above (c1), (c2), (d1) and (d2).

What is claimed is:

1. An inspection method for inspecting electrical characteristics of an inspection object by bringing each contact into contact with each of a plurality of electrodes of the inspection object placed on a table, the inspection method comprising:
   (a) measuring a height of a reference point provided on the table by a length measuring mechanism;
   (b) measuring a first rise amount taken for raising the reference point from a position of the table when the height of the reference point is measured up to a contact starting point in which the reference point comes into contact with a tip of the contact;
   (c) measuring a height of the electrode of the inspection object by the length measuring mechanism;
   (d) obtaining a second rise amount necessary for raising the electrode of the inspection object up to the contact starting point based on the height of the reference point obtained in (a), the first rise amount up to the contact starting point obtained in (b) and the height of the electrode obtained in (c);
   (e) bringing the electrode of the inspection object placed on the table into contact with the probe by raising the table only by the second rise amount obtained in (d); and
   (f) inspecting the electrical characteristics of the inspection object with the electrode and the tip of the contact in contact with each other electrically.

2. An inspection method for inspecting electrical characteristics of an inspection object by bringing each contact into contact with a plurality of electrodes of the inspection object placed on a table, the inspection method comprising:
   (a) measuring a height of a load detecting mechanism provided on the table by a length measuring mechanism;
   (b) measuring a first rise amount taken for raising the load detecting mechanism from a position of the load detecting mechanism when the height of the load detecting mechanism is measured up to a contact starting point in which the load detecting mechanism comes into contact with a tip of the contact;
   (c) measuring a height of the electrode by means of the length measuring mechanism; and
   (d) obtaining a second rise amount necessary for raising the electrode up to the contact starting point based on the height of the load detecting mechanism measured in (a), the first rise a mount measured in (b) and the height of the electrode measured in (c).

3. The inspection method according to claim 2 further comprising:
   (e) bringing the electrode of the inspection object placed on the table into contact with the tip of the contact by raising the table only by the second rise amount obtained in (d); and
   (f) inspecting the electrical characteristics of the inspection object with the electrode and the tip of the contact kept in electrical contact with each other.

4. The inspection method according to claim 2 further comprising:
   (b1) measuring the height of the contact starting point corresponding to a plurality of electrodes of the inspection object by repeating the (b2) and measuring the degree of parallelization between the table and the inspection object based on each height.

5. The inspection method according to claim 2 further comprising:
   (c1) measuring the height of a plurality of electrode surfaces of the inspection object by repeating the (c); and
   (c2) obtaining an inclination of a plane formed by the plurality of the electrodes based on the measured heights of the plurality of the electrodes.

6. The inspection method according to claim 2 further comprising:
   (d1) obtaining the second rise amount of each of the plurality of the electrodes of the inspection object by repeating the (d); and
   (d2) obtaining the degree of parallelization between the table and a plane formed by the tip of the contacts based on the second rise amount of each of the plurality of the electrodes.

7. The inspection method according to claim 2, wherein the length measuring mechanism is an optical system length measuring mechanism.

8. The inspection method according to claim 2, wherein the length measuring mechanism is an alignment mechanism to align the electrode of the inspection object with the contact of the contact holding mechanism.

9. The inspection method according to claim 2, wherein the length measuring mechanism has a capacitance sensor.

10. The inspection method according to claim 2, wherein the load detecting mechanism has a load cell.

* * * * *